United States Patent
Leigh et al.

(10) Patent No.: US 10,094,994 B2
(45) Date of Patent: Oct. 9, 2018

(54) ELECTRICAL/OPTICAL CONNECTOR

(75) Inventors: Kevin B. Leigh, Houston, TX (US);
George D. Megason, Spring, TX (US);
Paul K. Rosenberg, Sunnyvale, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 71 days.

(21) Appl. No.: 14/387,650

(22) PCT Filed: Apr. 25, 2012

(86) PCT No.: PCT/US2012/034996
§ 371 (c)(1),
(2), (4) Date: Sep. 24, 2014

(87) PCT Pub. No.: WO2013/162550
PCT Pub. Date: Oct. 31, 2013

(65) Prior Publication Data
US 2015/0016783 A1 Jan. 15, 2015

(51) Int. Cl.
G02B 6/38 (2006.01)
G02B 6/42 (2006.01)
G02B 6/43 (2006.01)
H01L 25/16 (2006.01)
H01R 12/71 (2011.01)
G02B 6/32 (2006.01)

(52) U.S. Cl.
CPC ............ *G02B 6/4293* (2013.01); *G02B 6/32* (2013.01); *G02B 6/3817* (2013.01); *G02B 6/3897* (2013.01); *G02B 6/4284* (2013.01); *G02B 6/43* (2013.01); *H01L 25/167* (2013.01); *H01R 12/716* (2013.01)

(58) Field of Classification Search
None
See application file for complete search history.

(56) References Cited

U.S. PATENT DOCUMENTS

| 4,737,008 A | | 4/1988 | Ohyama et al. | |
| 5,424,573 A | * | 6/1995 | Kato | G02B 6/4249 257/116 |
| 5,871,362 A | * | 2/1999 | Campbell | H01R 12/7047 439/67 |

(Continued)

FOREIGN PATENT DOCUMENTS

| CN | 1549943 | 11/2004 |
| CN | 1914532 | 2/2007 |

(Continued)

OTHER PUBLICATIONS

International Searching Authority, The Internaitonai Search Report and the Written Opinion, dated Dec. 26, 2012, 8 Pages.

(Continued)

*Primary Examiner* — Jerry Rahll
(74) *Attorney, Agent, or Firm* — Brooks, Cameron & Huebsch, PLLC

(57) ABSTRACT

An electrical/optical connector system can include a first circuit board with a floating optical connector and a first electrical contact and a second circuit board with a second optical connector to blind mate with the floating optical connector and a second electrical contact to blind mate with the first electrical contact.

20 Claims, 5 Drawing Sheets

(56) References Cited

U.S. PATENT DOCUMENTS

| | | | |
|---|---|---|---|
| 5,903,439 A | 5/1999 | Tamarkin | |
| 5,938,453 A * | 8/1999 | Ichimura | H01R 12/87 439/260 |
| 6,095,697 A | 8/2000 | Lehman et al. | |
| 6,305,848 B1 * | 10/2001 | Gregory | G02B 6/4246 385/134 |
| 6,386,889 B1 * | 5/2002 | Bishop | H01R 12/714 439/630 |
| 6,768,642 B2 | 7/2004 | Hines et al. | |
| 6,822,874 B1 * | 11/2004 | Marler | H05K 7/1452 361/724 |
| 7,331,717 B2 | 2/2008 | Kiani et al. | |
| 7,429,137 B2 * | 9/2008 | Sontag | H01R 12/716 385/75 |
| 7,466,880 B2 | 12/2008 | Windover | |
| 7,525,723 B2 | 4/2009 | Dabral et al. | |
| 7,649,751 B2 | 1/2010 | Nguyen et al. | |
| 7,854,554 B1 | 12/2010 | Karnopp et al. | |
| 7,905,664 B1 | 3/2011 | Stevens et al. | |
| 7,991,252 B2 | 8/2011 | Cheng et al. | |
| 9,011,020 B2 | 4/2015 | Ty Tan | |
| 2002/0180554 A1 * | 12/2002 | Clark | H05K 7/1452 333/33 |
| 2002/0181883 A1 * | 12/2002 | Harris | G02B 6/3897 385/53 |
| 2003/0044125 A1 * | 3/2003 | Kiani | G02B 6/3821 385/78 |
| 2003/0044127 A1 * | 3/2003 | Roth | G02B 6/3821 385/88 |
| 2003/0156386 A1 * | 8/2003 | Summers | H05K 1/0204 361/719 |
| 2004/0008494 A1 * | 1/2004 | Roth | G02B 6/3887 361/736 |
| 2004/0067027 A1 * | 4/2004 | Plotts | G02B 6/3897 385/75 |
| 2005/0078914 A1 * | 4/2005 | Cox | G02B 6/3897 385/55 |
| 2006/0002665 A1 | 1/2006 | Kiani et al. | |
| 2006/0067627 A1 | 3/2006 | Crews | |
| 2007/0190841 A1 | 8/2007 | Van Der Steen | |
| 2007/0258683 A1 | 11/2007 | Rolston et al. | |
| 2007/0297713 A1 | 12/2007 | Lu et al. | |
| 2008/0166090 A1 * | 7/2008 | Kiani | G02B 6/3897 385/89 |
| 2009/0324176 A1 | 12/2009 | Cheng et al. | |
| 2010/0027941 A1 | 2/2010 | Stewart et al. | |
| 2011/0222821 A1 | 9/2011 | Pitwon et al. | |
| 2011/0243505 A1 | 10/2011 | Su et al. | |
| 2012/0039562 A1 | 2/2012 | Tan et al. | |

FOREIGN PATENT DOCUMENTS

| | | |
|---|---|---|
| EP | 2416368 | 2/2012 |
| JP | 2002296464 | 10/2002 |
| WO | WO-2001090793 | 11/2001 |
| WO | WO-2011084155 | 7/2011 |

OTHER PUBLICATIONS

Papakonstantinou, I. et al., Low-cost Precision, Self-alignment Technique for Coupling Laser and Photodiode Arrays to Polymer Waveguide Arrays on Multilayer PCBs, (Research Paper), IEEE Transactions on Advanced Packaging, Aug. 2008, pp. 502-511, vol. 31, No. 3.

Hewlett-Packard Development Company, International Appl. No. PCT/US2011/050551 entitled Mechanically Aligned OPtical Engine filed Sep. 6, 2011 (29 pages).

Hewlett-Packard Development Company, International Application No. PCT/US2012/034996 entitled Electrical/Optical Connector filed Apr. 25, 2012 (24 pages).

Hewlett-Packard Development Company, International Application No. PCT/US2012/035822 entitled Optical Base Layer filed Apr. 30, 2012 (51 pages).

International Searching Authority, The International Search Report and the Written Opinion, Mar. 28, 2013, 9 Pages.

Mathai, U.S. Appl. No. 13/273,983 entitled Optoelectronic Interface filed Oct. 14, 2011 (35 pages).

Schow. IBM Research, Goal: Translating Data Center Requirements to Optical Component R&D, Mar. 2012 (33 pages).

Takagi, Y, et al., Optoelectronic Package Having Low-loss Optical Waveguide Hole with Core-clad Structure for Chip3 to Chip Interconnection. (Research Paper), Photonics Technology Letters, IEEE. Dec. 15, 2008, pp. 2033-2035, vol. 20, No. 24.

* cited by examiner

ELECTRICAL/OPTICAL CONNECTOR

BACKGROUND

Data rates and bandwidths in computing systems have increased over time. In the past, computing systems have utilized electrical components. However, for some applications, both optical components and electrical components are now concurrently utilized.

Optical input/output may be used to transmit data between system components. For some applications, optical input/output may provide greater bandwidth and/or lower electromagnetic interference than other types of input/outputs. Optical fibers may be employed for optical input/output. For some applications, optical fibers may be coupled to other optical fibers and/or system components by an optical connector.

DETAILED DESCRIPTION

Figure 1A:
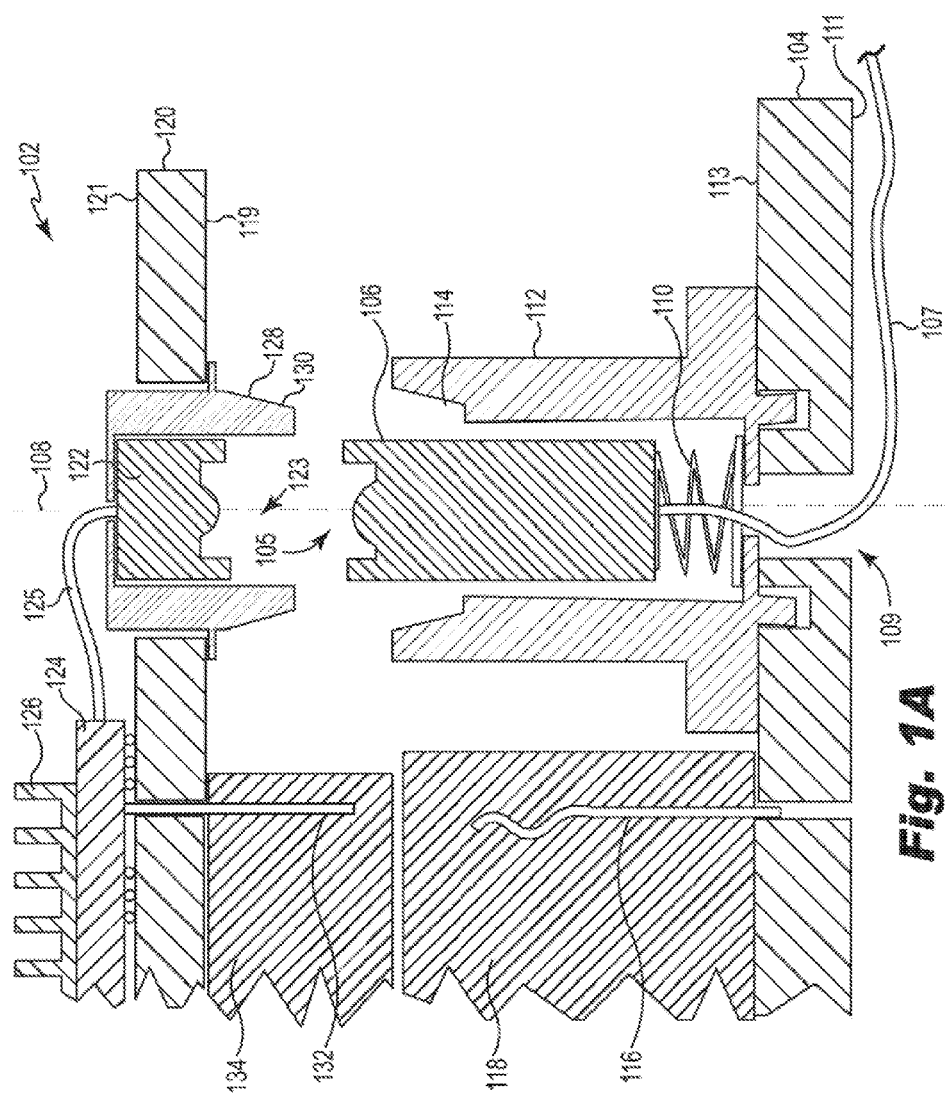
FIG. 1A illustrates a perspective view of an example of an electrical/optical connector system.

Electrical/optical connectors and electrical/optical connector systems are described herein. As an example, an electrical/optical connector system may include a first circuit board with a first electrical contact and a floating optical connector and a second circuit board with a second electrical contact to blind mate with first electrical contact and a second optical connector to blind mate with the floating optical connector.

For electrical/optical connector systems, electrical contacts and optical connectors may be employed to interconnect system elements. Reduced performance may result from a misalignment of the electrical contacts and/or the optical connectors, e.g., during blind mating of the electrical contacts and/or the optical connectors. Therefore, it is desirable to reduce misalignment of the electrical contacts and/or the optical connectors. Some examples of the present disclosure may help to reduce misalignment of the electrical contacts and/or the optical connectors of an electrical/optical connector system, e.g., during blind mating of the electrical contacts and/or the optical connectors.

In the following detailed description of the present disclosure, reference is made to the accompanying drawings that form a part hereof, and in which is shown by way of illustration how some examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1A, and a similar element may be referenced as 204 in FIG. 2. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure and should not be taken in a limiting sense.

FIG. 1A illustrates a perspective view of an example of an electrical/optical connector system 102. As illustrated in FIG. 1A, optical connectors and electrical contacts, as discussed herein are in unmated positions. The electrical/optical connector system 102 can include a first circuit board 104. The first circuit board 104 can be a printed circuit board, among other types of circuit boards, e.g., flex circuit, plated plastics Examples of the present disclosure provide that the first circuit board 104 can be a motherboard, which may also be referred to as a main board, system board, or a planar board, among other references. For example, the present disclosure provides that the electrical/optical connector system 102, including the first circuit board 104, can be located within a computing chassis.

The electrical/optical connector system 102 can include a floating optical connector 106. The floating optical connector 106 is configured to blind mate with another optical connector, as discussed herein. The floating optical connector 106 can be coupled to, e.g., separably attached, to an optical cable 107. The optical cable 107 can transmit and/or receive data, e.g., when the floating optical connector 106 is blind mated with another optical connector, as discussed herein. As illustrated in FIG. 1A, the optical cable 107 can pass through an opening 109 in the first circuit board 104, e.g., to be located near an outer surface 111 of the first circuit board 104, relative to the mated optical connectors as discussed herein. However, examples of present disclosure are not limited as such. For example, the optical cable 107 can pass near an inner surface 113 of the first circuit board 104 relative to the mated optical connectors as discussed herein, e.g., when the first circuit board 104 does not include the opening 109. While FIG. 1A illustrates a single floating optical connector 106, examples of the present disclosure are not so limited. For instance, a number of examples of the present disclosure provide that the electrical/optical connector system 102 can include a plurality of floating optical connectors, where each of the plurality of floating optical connectors is configure blind mate with another optical connector.

The floating optical connector 106 can float, e.g., move, in a direction parallel to an optical mating axis 108, discussed herein. The electrical/optical connector system 102 can include a biasing member 10. The biasing member 110 can be a spring; however other biasing members 10 are possible. Some examples of the present disclosure provide that the biasing member 110 can bias the floating optical connector 106 in a direction parallel to the optical mating axis 108. For example, the biasing member 110 can be a spring that exerts a force, e.g., a spring force, on the floating optical connector 106 in a direction that is perpendicular to, e.g., away form, the first circuit board 104. Additionally, the biasing member 110 can compress. For example, the biasing member 110 can compress when a force is applied to the floating optical connector 106 in a direction that is parallel to the optical mating axis 108 and toward the first circuit board 104. The biasing and/or compressing of the biasing member 110 can provide that the floating optical connector 106 can float, as discussed herein.

The electrical/optical connector system 102 can include a first optical connector housing 112. As illustrated in FIG. 1A, the first optical connector housing 112 can extend from the first circuit board 104. Examples of the present disclosure provide that the first optical connector housing 112 can house, e.g., at least partially surround, the floating optical connector 106. As such, the floating optical connector 106 can float within the first optical connector housing 112. The first optical connector housing 112 can include a surface 114 that is configured to receive a portion of a second optical connector housing, as discussed herein, during blind mating.

The electrical/optical connector system 102 can include a first electrical contact 116. The first electrical contact 116 can transmit and/or receive data, e.g., when the first electrical contact 116 is blind mated with another electrical contact, as discussed herein. The first electrical contact 116 can be housed within and/or located on a first electrical contact housing 118. Some examples of the present disclosure provide that the first electrical contact housing 118 and the first optical connector housing 112 can be physically separated, e.g., as illustrated in FIG. 1A. However, embodiments are not so limited. For example, the first electrical contact housing 118 and the first optical connector housing 112 can be directly contacting one another or integral. The first electrical contact 116 is configured to bond mate with another electrical contact, as discussed herein. The first electrical contact 116 can be considered a component of the first circuit board 104. While FIG. 1A illustrates a single first electrical contact 116 that is a component of the first circuit board 104, examples of the present disclosure are not so limited. For instance, a number of examples of the present disclosure provide that the electrical/optical connector system 102 can include a plurality of electrical contacts that are components of the first circuit board 104, where each of the plurality of electrical contacts is configured to blind mate with another electrical contact.

The electrical/optical connector system 102 can include a second circuit board 120. The second circuit board 120 can be a printed circuit board, among other types of circuit boards. Examples of the present disclosure provide that the second circuit board 120 can be an adapter card, which may also be referred to as a mezzanine card, or a daughter card, among other references. The second circuit board 120 can provide data processing, data storage, signal conversion, system control functions, and/or network connection functions, among other computing functions.

The electrical/optical connector system 102 can include a second optical connector 122. The second optical connector 122 is configured to blind mate with another optical connector, e.g., the floating optical connector 106. The second optical connector 122 can be coupled to an electrical/optical engine 124, e.g. via a fiber 125. The electrical/optical engine 124 can receive and/or transmit data, e.g., when second optical connector 122 is blind mated with another optical connector, e.g., floating optical connector 106. Some examples of present disclosure provide that the second optical connector 122 is a fixed optical connector, as described herein. While FIG. 1A illustrates a single second optical connector 122, examples of the present disclosure are not so limited. For instance, a number of examples of the present disclosure provide that the electrical/optical connector system 102 can include a plurality of optical connectors, where each of the plurality of fixed optical connectors is configured to blind mate with another optical connector, e.g., one of the plurality of floating optical connectors.

The electrical/optical connector system 102 can include a second optical connector housing 128. As illustrated in FIG. 1A, the second optical connector housing 128 can extend from the second circuit board 120. Examples of the present disclosure provide that the second optical connector housing 128 can house, e.g., at least partially surround, the second optical connector 122. The second optical connector housing 128 can include a surface 130 that is configured to engage the first optical connector housing 112, e.g., during blind mating of the floating optical connector 106 and the second optical connector 122. For example, the surface 130 of the second optical connector housing 128 can contact the surface 114 of the first optical connector housing 112 provide a degree of alignment as the second optical connector 122 approaches the floating optical connector 106 during blind mating. Some examples of the present disclosure provide that the degree of alignment can increase as the second optical connector 122 progressively approaches the floating optical connector 106, e.g., the surface 114 and the surface 130 can be configured, in conjunction with an end face 123 of the second optical connector 122 and an end face 105 of the floating optical connector 106, to align the floating optical connector 106 and the second optical connector 122 as the optical connectors are blind mated.

As illustrated in FIG. 1A, some examples of the present disclosure provide that the electrical/optical engine 124 can be located adjacent to a surface 121 of the second circuit board 120. However, examples of the present disclosure are not limited as such, as discussed further herein. Some examples of the present disclosure provide that the electrical/optical engine 124 is configured to be located between the second circuit board 120 and first circuit board 104, e.g., when the second optical connector 122 and the floating optical connector 106 are blind mated. For example, the electrical/optical engine 124 can be located adjacent to a surface 119 of the second circuit board 120.

The electrical/optical connector system 102 can include a heat sink 126. As illustrated in FIG. 1A, some examples of the present disclosure provide that the heat sink 126 is coupled to the electrical/optical engine 124. Some examples of the present disclosure provide that the heat sink 126 is configured to be located between the second circuit board 120 and first circuit board 104, e.g., when the second optical connector 122 and the floating optical connector 106 are blind mated. For example, the heat sink 126 can be located adjacent to a surface 119 of the second circuit board 120. However, examples of the present disclosure are not so limited. For example, some examples of the present disclosure provide that the heat sink 126 can be located adjacent to the surface 121 of the second circuit board 120.

The electrical/optical connector system 102 can include a second electrical contact 132. The second electrical contact 132 can be housed within and/or located on a second electrical contact housing 134. The second electrical contact 132 can transmit and/or receive data, e.g., when the second electrical contact 132 is blind mated with the first electrical contact 116. The second electrical contact 132 can be considered a component of the second circuit board 120. While FIG. 1A illustrates a single second electrical contact 132 that is a component of the second circuit board 120, examples of the present disclosure are not so limited. For instance, a number of examples of the present disclosure provide that the electrical/optical connector system 102 can include a plurality of electrical contacts that are components of the second circuit board 120, where each of the plurality of electrical contacts is configured to blind mate with another electrical contact. Some examples of the present disclosure provide that the second electrical contact housing 134 and the second optical connector housing 128 can be physically separated, e.g., as illustrated in FIG. 1A. However, embodiments are not so limited. For example, the second electrical contact housing 134 and the second optical connector housing 128 can be directly contacting one another or integral.

Figure 1B:
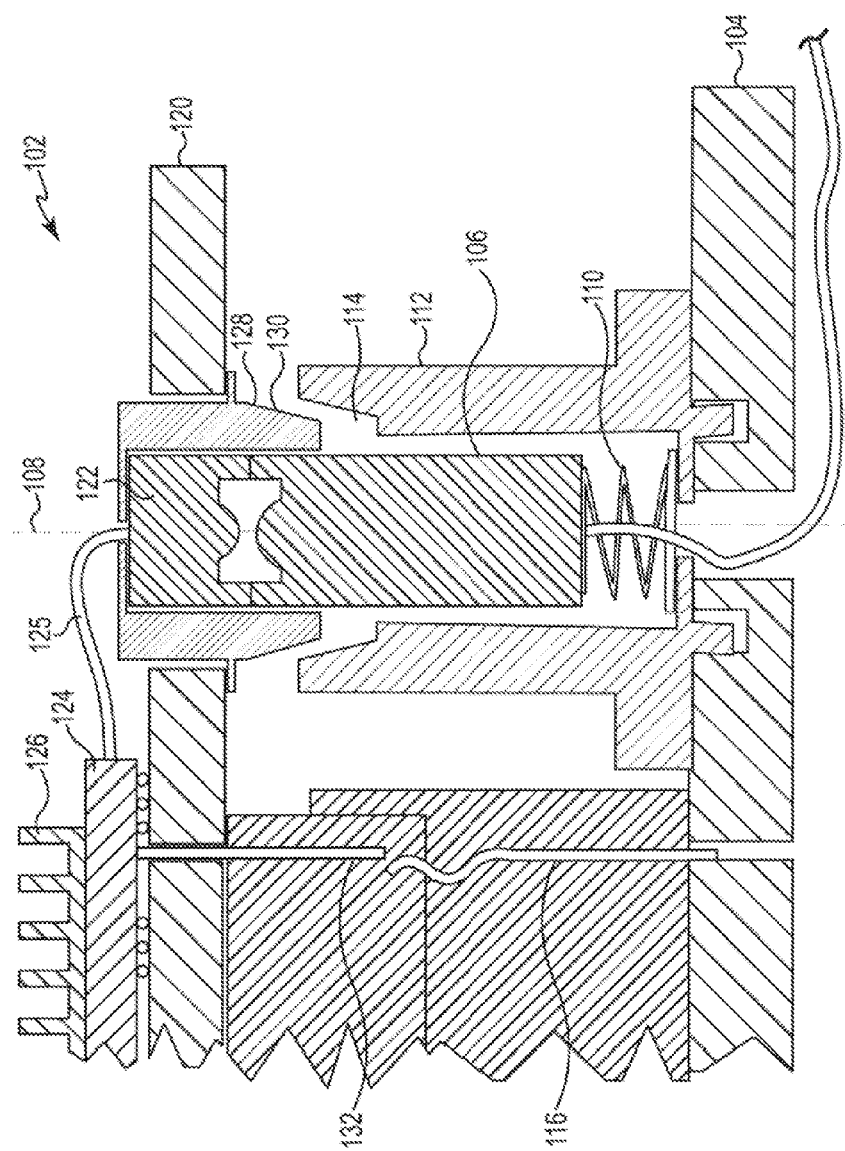
FIG. 1B illustrates a perspective view of the example of the electrical/optical connector system illustrated in FIG. 1A.

FIG. 1B illustrates a perspective view of an example of the electrical/optical connector system 102 illustrated in FIG. 1A. As illustrated in FIG. 1B, the floating optical connector 106 and the second optical connector 122 are in a mated position and the first electrical contact 116 and the second electrical contact 132 are in an unmated position. As used herein, blind mating refers to the connecting of components such that the connection points are not visible. For blind mating, some examples of the present disclosure provide built-in alignment features on the components, e.g., the optical connector housings and the end faces of the optical connectors as discussed herein. When the alignment features are engaged the blind mating can proceed without further manual alignment. As discussed herein, some examples of the present disclosure provide that the optical connectors 106, 122 are configured to mate before the electrical contacts 116, 132.

As illustrated in FIG. 1B, the first circuit board 104 and the second circuit board 120 are being interconnected by moving the second circuit board 120 nearer to the first circuit board 104, as compared, for example, to FIG. 1A, where the optical connectors 106, 122 and the electrical contacts 116, 132 are in unmated positions. As discussed, the surface 130 of the second optical connector housing 128 can engage the first optical connector housing 112, e.g., the surface 114, to provide a degree of alignment as the second optical connector 122 approaches the floating optical connector 106. When the second optical connector 122 contacts the floating optical connector 106, as illustrated in FIG. 1B, the floating optical connector 106 and the second optical connector 122 are blind mated. A force applied to the floating optical connector 106 in a direction that is parallel to the optical mating axis 108 and toward the first circuit board 104 can compress the biasing member 110. Advantageously, this compression of the biasing member 110 can provide that the optical connectors, e.g., the blind mated second optical connector 122 and floating optical connector 106, can be overdriven while the optical connectivity is maintained. The compression of the biasing member 110 can provide a positive pressure, e.g., a force in a direction that is parallel to the optical mating axis 108 and away the first circuit board 104, such as toward the second 120, to the floating optical connector 106. This positive pressure can advantageously help to maintain the optical connection between the floating optical connector 106 and the second optical connector 122, for example while the second circuit board 120 travels nearer to the first circuit board 104 to blind mate the first electrical contact 116 and the second electrical contact 132.

Figure 1C:
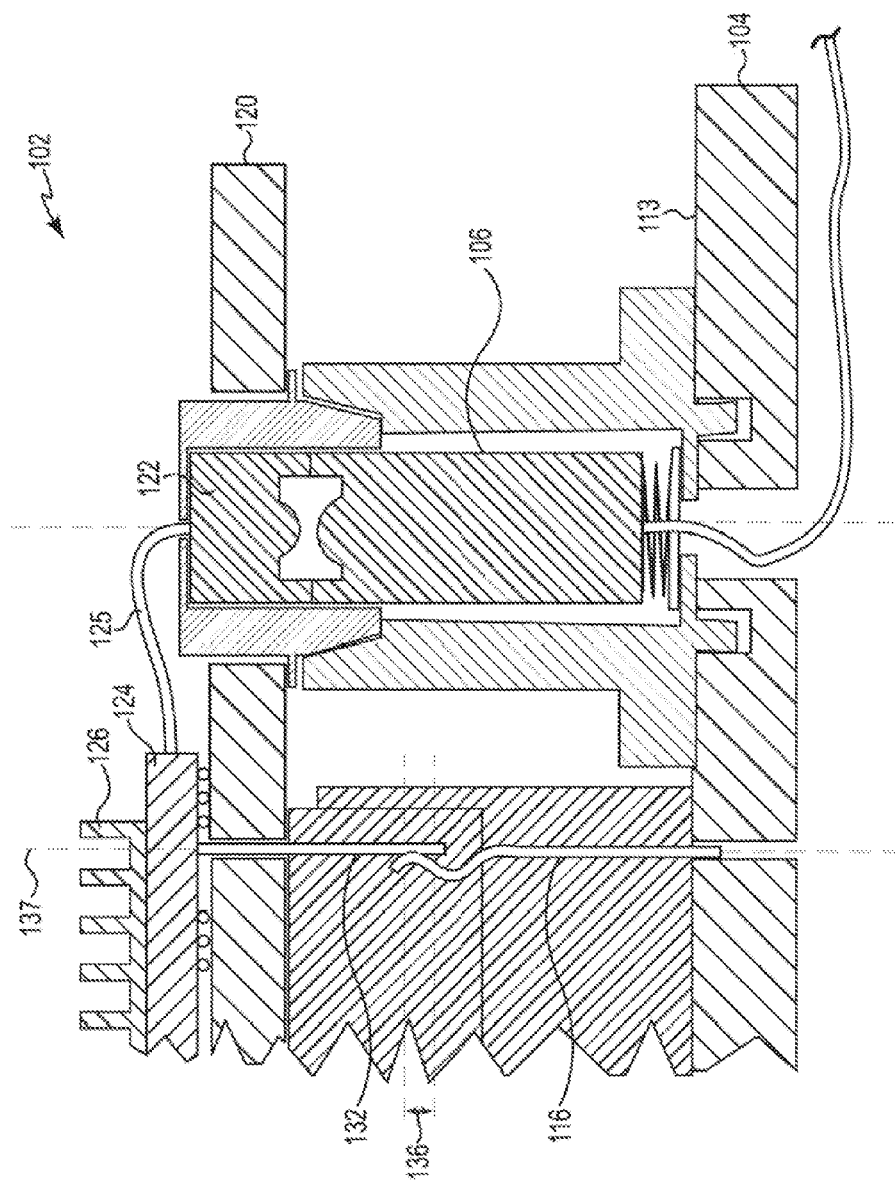
FIG. 1C illustrates a perspective view of the example of the electrical/optical connector system illustrated in FIG. 1A.

FIG. 1C illustrates a perspective view of an example of the electrical/optical connector system 102 illustrated in FIG. 1A. As illustrated in FIG. 1C, the floating optical connector 106 and the second optical connector 122 are in a mated position and the first electrical contact 116 and the second electrical contact 132 are also in a mated position.

Some examples of the present disclosure provide that the second electrical contact 132 is configured to wipe the first electrical contact 116. For instance, as illustrated in FIG. 1C, the second electrical contact 132 has wiped the first electrical contact 116. As used herein, wiping refers to the sliding of an electrical contact past another electrical contact while the two electrical contacts are touching, e.g., when the first electrical contact 116 and the second electrical contact 132 are blind mated. Some examples of the present disclosure provide a wipe tolerance 136. The wipe tolerance 136 can be a length of an electrical contact, e.g., a length of the first electrical contact 116, over which a length of another electrical contact, e.g., a length of the second electrical contact 132 travels during electrical engagement or separation. For various applications, differing wipe tolerances 136 may be employed. Advantageously, the wipe tolerance 136 and the positive pressure provided by the biasing member 110 can help maintain the optical connection between the floating optical connector 106 and the second optical connector 122 while maintaining electrical connection between the first electrical contact 116 and the second electrical contact 132.

As illustrated in FIG. 1C, the floating optical connector 106 and the second optical connector 122 are vertically blind mated. For example, when the floating optical connector 106 and the second optical connector 122 are vertically blind mated the second 120 can occupy a horizontal plane that is different than, but parallel to, another horizontal plane occupied by the first circuit board 104. Examples of the present disclosure provide that when the floating optical connector 106 and the second optical connector 122 are vertically blind mated, the optical mating axis 108 is perpendicular to the surface 113 of the first circuit board 104. However, examples are not limited as such. Additionally, as illustrated in FIG. 1C, the first electrical contact 116 and the second electrical contact 132 are vertically blind mated along an electrical mating axis 137.

Figure 1D:
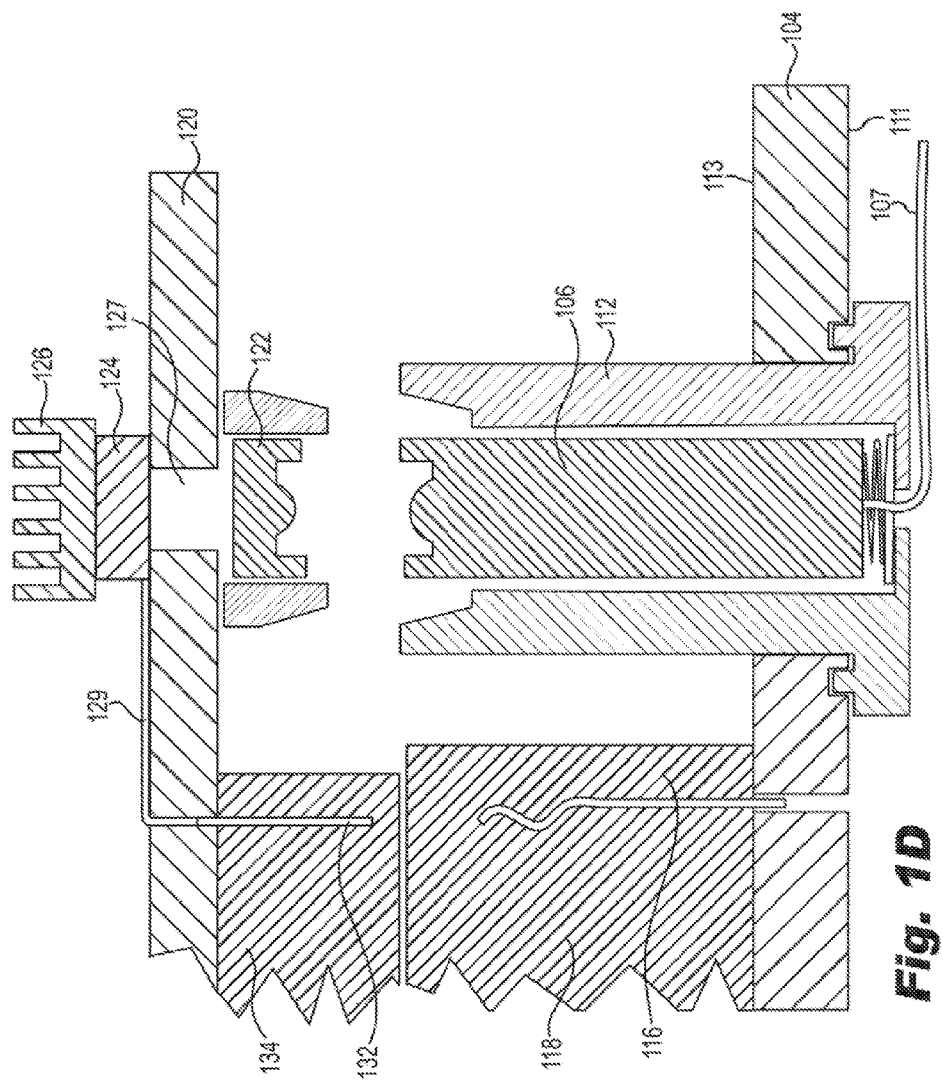
FIG. 1D illustrates a perspective view of an example of an electrical/optical connector system.

FIG. 1D illustrates a perspective view of an example of an electrical/optical connector system 102. As illustrated in FIG. 1D, the optical connectors and the electrical contacts, as discussed herein are in unmated positions. As illustrated in FIG. 1D, the electrical/optical engine 124 can be coupled to the second optical 122 connector by an optical signal path 127. The optical signal path 127 can directly interface with the electrical/optical engine 124. As illustrated in FIG. 1D, second electrical contact 132 can be coupled to the electrical/optical engine 124 by an electrical signal trace 129.

As illustrated in FIG. 1D, examples of the present disclosure provide that the floating optical connector 106 is bottom mounted, relative to the first circuit board 104. For example, a portion of the first optical connector housing 112 may be located adjacent to a surface 131 of the first optical connector housing 112. The surface 131 can be opposite the surface 113, relative to the first circuit board 104.

Figure 2:
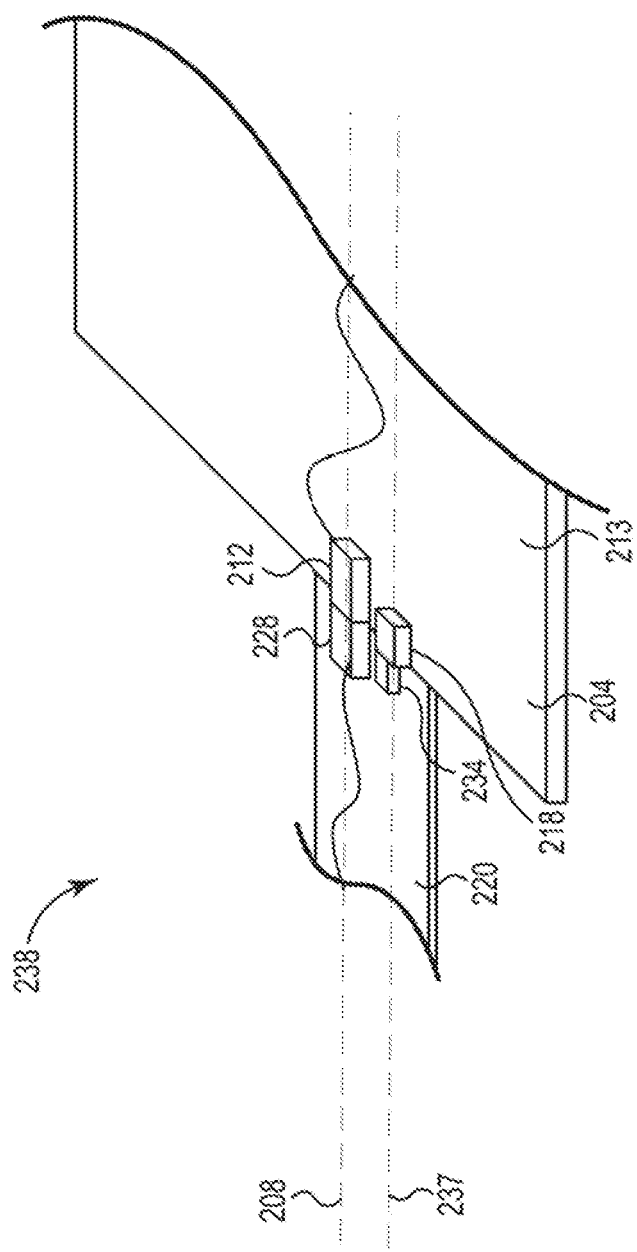
FIG. 2 illustrates a perspective view of an example of an electrical/optical connector system.

FIG. 2 illustrates a perspective view of an example of an electrical/optical connector system 238. As illustrated in FIG. 2, the floating optical connector that is housed within the first optical connector housing 212 and the second optical connector that is housed within the second optical connector housing 228 are horizontally blind mated. For example, when the floating optical connector that is housed within the first optical connector housing 212 and the second optical connector that is housed within the second optical connector housing 228 are horizontally blind mated the second circuit board 220 can occupy a horizontal plane that is shared with the first circuit board 204. Examples of the present disclosure provide that when the floating optical connector that is housed within the first optical connector housing 212 and the second optical connector that is housed within the second optical connector housing 228 are horizontally blind mated, the optical mating axis 208 is parallel to the surface 213 of the first circuit board 204. Additionally, as illustrated in FIG. 2, the first electrical contact housed within the first electrical contact housing 218 and the second electrical contact housed within second electrical contact housing 234 are horizontally blind mated along the electrical mating axis 237.

A number of examples of the present disclosure provide that the optical connectors discussed herein, e.g., the floating optical connector and the second optical connector, include an optical coupling lens. Examples of optical coupling lenses include, but are not limited to, collimating lenses and imaging lenses. For various applications the optical coupling lenses can be formed from differing materials. For example, the optical coupling lenses can be formed from plastic or silicon, among other materials.

A number of examples of the present disclosure provide that the electrical contacts discussed herein, e.g., the first electrical contact and the second electrical contact, are formed from rigid components, flexible components, or combinations thereof. For example the first electrical contact can be a rigid contact that blind mates with the second electrical contact that can be a spring contact.

Although specific examples have been illustrated and described herein, those of ordinary skill in the art will appreciate that an arrangement calculated to achieve the same results can be substituted for the specific embodiments shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the examples of the present disclosure includes other applications in which the above structures are used. Therefore, the scope of examples of the present disclosure should be determined with reference to the appended claims, along with the full range of equivalents to which such claims are entitled.

In the foregoing Detailed Description, some features are grouped together in single example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a single disclosed example. Thus, the following claims are hereby incorporated into the Detailed Description, with each claim standing on its own as a separate example.

What is claimed:

1. An electrical/optical connector system, comprising:
a first circuit board comprising:
a first housing having a first interior;
a floating optical connector within the first interior of the first housing;
a biasing member within the first interior and coupled to the floating optical connector; and
a first electrical contact; and
a second circuit board comprising:
a second housing nestable within the first interior, the second housing having a second interior;
a second optical connector recessed within the second interior to blind mate with the floating optical connector; and
a second electrical contact to blind mate with the first electrical contact while the second optical connector is blind mating with the floating optical connector.

2. The system of claim 1, wherein the second electrical contact is to wipe the first electrical contact.

3. The system of claim 1, including the biasing member that biases the floating optical connector in a direction parallel to an optical mating axis of the floating optical connector and the second optical connector.

4. The system of claim 1, wherein the floating optical connector is to blind mate with the second optical connector prior to the first electrical contact blind mating with the second electrical contact.

5. The system of claim 1, wherein the floating optical connector is to vertically blind mate with the second optical connector.

6. The system of claim 1, wherein the floating optical connector is to horizontally blind mate with the second optical connector.

7. The system of claim 1, wherein the first circuit board is a motherboard.

8. The system of claim 1, wherein the second circuit board is an adapter card.

9. An electrical/optical connector system, comprising:
a first circuit board with a first optical connector housing and a first electrical contact, wherein the first optical connector housing houses a floating optical connector and the first electrical contact is flexible; and
a second circuit board with a second optical connector housing and a second electrical contact to blind mate with the first electrical contact, wherein the second optical connector housing houses a second optical connector to blind mate with the floating optical connector, wherein one of the first optical connector housing and the second optical connector housing is nestable within the other of the first optical connector housing and the second optical connector housing.

10. The system of claim 9, wherein the second optical connector housing is to engage the first optical connector housing as the second optical connector and the floating optical connector blind mate.

11. The system of claim 9, further including an electrical/optical engine that is coupled to the second optical connector.

12. The system of claim 9, wherein the floating optical connector floats in a direction parallel to an optical mating axis of the floating optical connector and the second optical connector.

13. An electrical/optical connector system, comprising:
a first circuit board with a first optical connector housing and a first electrical contact, wherein the first optical connector housing houses a floating optical connector and the first electrical contact is flexible; and
a second circuit board with a second optical connector housing that houses a second optical connector to blind mate with the floating optical connector and a second electrical contact to blind mate with the first electrical contact, wherein the second circuit board includes an electrical/optical engine coupled to the second optical connector and a first electrical contact housing of the first electrical contact and the second electrical contact housing of the second electrical contact facilitates the blind mate between the first electrical contact and the second electrical contact and wherein the second optical connector housing is nestable within the first optical connector housing during blind mating of the floating optical connector and the second optical connector.

14. The system of claim 13, wherein the floating optical connector and the second optical connector are to horizontally blind mate such that connection points between the floating optical connector and the second optical connector are not visible.

15. The system of claim 13, wherein the second circuit board is to be located between the electrical/optical engine and the first circuit board when the second optical connector and the floating optical connector are blind mated.

16. The system of claim 1, wherein the first circuit board and the second circuit board are aligned in parallel to each other and in a direction perpendicular to the optical mating axis of the floating optical connector and the second optical connector.

17. The system of claim 9, wherein the first circuit board and the second circuit board are aligned in parallel to each other and in a direction perpendicular to the optical mating axis of the floating optical connector and the second optical connector.

18. The system of claim 1, wherein the floating optical connector projects beyond the interior of the first housing prior to blind mating with the second optical connector and wherein the second housing is nestable within the first housing prior to blind mating of the floating optical connector and the second optical connector.

19. The system of claim 18, wherein the first interior comprises an internal shoulder to contact the second housing during insertion of the second housing into the first housing to limit insertion of the second housing into the first interior of the first housing and wherein the floating optical connector is to blind mate with the second optical connector during insertion of the second housing into the first housing prior to the internal shoulder contacting the second housing.

20. The system of claim 19, wherein the first circuit board further comprises a first electrical contact housing in which the first electrical contact extends and wherein the second circuit board further comprises a second electrical contact housing in which the second electrical contact extends, wherein one of the first electrical contact housing and the second electrical contact housing is nestable within the other of the first elected contact housing and the second electrical contact housing during blind mating of the floating optical connector and the second optical connector.

* * * * *